United States Patent [19]

Bongianni

[11] 4,138,651

[45] Feb. 6, 1979

[54] MULTIPLE MAGNETIC LAYER COMPOSITE FOR MAGNETOSTATIC SURFACE WAVE PROPAGATION

[75] Inventor: Wayne L. Bongianni, Placentia, Calif.

[73] Assignee: Rockwell International Corporation, El Segundo, Calif.

[21] Appl. No.: 831,040

[22] Filed: Sep. 6, 1977

[51] Int. Cl.² .................... H03H 9/30; H01P 9/00; H01L 43/10

[52] U.S. Cl. .................... 333/30 R; 333/31 R; 333/97 R

[58] Field of Search .............. 333/70 R, 30 R, 30 M, 333/71, 24.2, 24.1, 29, 73 R, 73 W, 95 R, 95 S, 31 R, 98 R, 31 A, 97 R; 252/62.57; 365/171–173

[56] References Cited

U.S. PATENT DOCUMENTS 3,864,647 2/1975 Bongianni .................... 333/30 M

Primary Examiner—Alfred E. Smith

Assistant Examiner—Marvin Nussbaum

Attorney, Agent, or Firm—H. Frederick Hamann; G. Donald Weber, Jr.; Gilbert H. Friedman

[57] ABSTRACT

A monolithic multiple magnetic layer composite comprising a substrate of a magnetic-wave-inactive material and a layer of magnetic-wave-active material deposited on each of the two opposing sides of the substrate. The composition and, consequently, the internal magnetization of each layer of magnetic-wave-active material is different from that of the other layer. The composite can be used in a magnetostatic surface wave delay line having a ground plane and means for providing a uniform bias magnetic field for the composite. Along with the geometrical parameters of the composite and the delay line, the internal magnetizations of the two layers of magnetic-wave-active material are preselected to provide a time-delay versus frequency characteristic for the delay line which is either approximately linearly dispersive or nondispersive.

6 Claims, 4 Drawing Figures

MULTIPLE MAGNETIC LAYER COMPOSITE FOR MAGNETOSTATIC SURFACE WAVE PROPAGATION

The invention herein described was made in the course of or under a contract or subcontract thereunder with the Air Force.

BACKGROUND OF THE INVENTION

1. Field of the Invention

This invention relates to the field of high frequency magnetostatic surface wave delay lines and, more particularly, to a multiple magnetic layer composite useful in nondispersive and linearly dispersive magnetostatic surface wave delay lines.

2. Description of the Prior Art

At X-band frequencies and above, magnetic devices employing magnetostatic surface wave propagation have higher efficiency (lower losses) than can be achieved using either electromagnetic wave propagation in coaxial cable, bulk acoustic wave propagation, or surface acoustic wave propagation.

The time-delay versus frequency characteristic of a magnetostatic surface wave device employing only a single layer or film of magnetic-wave-active material is called monotonically dispersive. That is, the characteristic is neither nondispersive nor linearly dispersive over a sufficiently large band of frequencies to be of practical interest.

The prior art reveals several approaches to providing a nondispersive or linearly dispersive characteristic for a magnetostatic surface wave delay line. Disposing a layer of a magnetic-wave-propagation-modifying material such as an electrically conductive ground plane in the vicinity of a layer of magnetic-wave-active material significantly alters the time-delay versus frequency characteristic. The altered characteristic approximates nondispersive or linearly dispersive behavior in the vicinity of points of inflection in the characteristic. The points of inflection appear when the ground plane is used. The approximation is improved and the bandwidth of a region of nondispersive or linearly dispersive behavior is broadened by using more than one layer of magnetically-coupled, magnetic-wave-active material in the delay line. When the layers of magnetic-wave-active material in a layered composite have different magnetizations, their points of inflection appear in the overall characteristic displaced from each other. This produces the bandwidth broadening effect in the overall time-delay characteristic. The magnetization of each of the plurality of layers of magnetic-wave-active material can be due to differences in the internal magnetizations of different materials, differences in the crystallographic orientation of the layers of material relative to the bias magnetic field, spatial variation or non-uniformity in the bias magnetic field, or a combination of some or all of these factors.

3. Prior Art Statement

The most pertinent prior art discovered by applicant relative to this invention is listed herewith:

(1) U.S. Pat. No. 3,864,647, Bongianni, "Substantially Linear Magnetic Dispersive Delay Line and Method of Operating It" (1975).

(2) The Microwave Journal, (Bongianni), January 1974, pp. 49–52, 71, "X-Band Signal Processing Using Magnetic Waves".

(3) Journal of Applied Physics, (Ganguly et al.), Vol. 45, No. 10, October 1974, pp. 4665–4667, "Magnetostatic Wave Propagation in double layers of magnetically anisotropic slabs".

(4) IEEE Transactions on Microwave Theory and Techniques, (Tsutsumi et al.), Vol. MTT-24, No. 9, September 1976, pp. 591–597, "Effect of the Magnetic Perturbation on Magnetostatic Surface-Wave Propagation".

The patent to Bongianni, discloses a layered composite arrangement in a magnetostatic surface wave device wherein a plurality of layers of magnetic-wave-active material are spaced apart from each other and from a ground plane by intervening layers of magnetic-wave-inactive materials. The layers of magnetic-wave-active material have similar, preferably substantially identical, characteristics. The similarity prevents the response of a more efficient layer from dominating the response of a lossier layer. A preferred embodiment is disclosed which comprises films of yttrium iron garnet (YIG) deposited on both sides of the gadolinium gallium garnet (GGG) substrate in a liquid phase epitaxy (LPE) system. Each magnetic-wave-active layer is given a magnetic characteristic different from other layers by causing the bias magnetic field for the delay line to have a substantial non-zero gradient in a direction perpendicular to the layers. A three-magnet configuration is disclosed for producing such a field.

The article by Bongianni discloses substantially the same device as the first listed reference.

In the article by Ganguly et al., a layered composite for a magnetostatic surface wave device is disclosed wherein substantially similar but physically distinct slabs of magnetic-wave-active material are given a different crystallographic orientation relative to a uniform bias magnetic field. The different orientation relative to the field causes each slab to have different magnetic characteristics.

The article by Tsutsumi et al, discloses a layered composite for a magnetostatic surface wave device wherein two physically distinct slabs of different magnetic-wave-active materials (namely, YIG and Ga-YIG), each having different magnetic saturations, are stacked in a uniform bias magnetic field. The difference in the internal magnetization of the two different materials provides the differing magnetic characteristics.

None of the above-listed references disclose a monolithic multiple magnetic layer composite for use in a nondispersive or linearly dispersive magnetostatic surface wave delay line having a uniform bias magnetic field wherein two films having different magnetic characteristics are epitaxially deposited on opposite sides of the same magnetic-wave-inactive substrate.

SUMMARY OF THE INVENTION

The invention provides an improved multiple magnetic layer composite for use in constructing nondispersive or linearly dispersive magnetostatic surface wave delay lines.

The invention is accomplished by providing two films of magnetic-wave-active material having compositions different from each other epitaxially deposited on the opposing sides of a substrate of mangetic-wave-inactive material. The compositions of the two films are selected to provide a selected difference in their internal magnetizations but approximately similar propagation loss characteristics or ferrimagnetic resonance linewidth. The substrate is preferably cut and polished to provide uniform spacing between the two films. This spacing is selected to provide that amount of magnetic interaction between the two films which, together with the selected difference in internal magnetization, will result in nondispersive or linearly dispersive propagation, as desired, when the monolithic composite is operated as part of a magnetostatic surface wave delay line in a substantially uniform bias magnetic field.

DESCRIPTION OF THE PREFERRED EMBODIMENT

Figure 1:
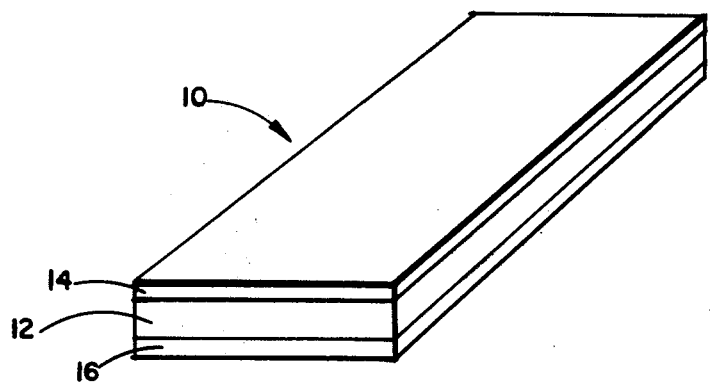
FIG. 1 is a perspective view of a multiple magnetic layer device in accordance with the invention.

FIG. 1 illustrates a monolithic, multiple magnetic layer, composite 10 suitable for use in magnetostatic surface wave delay lines. The composite 10 comprises a substrate 12 having ferromagnetic layers 14 and 16 disposed on opposite surfaces thereof. Materials are termed "ferrimagnetic" herein in accordance with the definition of ferrimagnetism given in the Encyclopedia Brittanica. The substrate 12 is of magnetic-wave-inactive material which may be a dielectric material which is neither magnetically active nor magnetically lossy. A preferred material for the substrate 12 is cut from a single crystal of a nonmagnetic garnet, for example, gadolinium gallium garnet (GGG).

The substrate 12 is preferably cut and polished to have a substantially uniform thickness. This uniform thickness provides an equal amount of magnetic interaction between the ferrimagnetic layers 14 and 16 over their entire extent.

The two ferrimagnetic layers 14 and 16 are of magnetic-wave-active material. Layers 14 and 16 are preferably epitaxially deposited monocrystalline films of a magnetic garnet such as yttrium iron garnet (YIG) having dopants or substituents incorporated therein which provide the desired magnetic characteristics.

The compositions of layers 14 and 16 are controllably adjusted during the epitaxial deposition thereof to cause layer 14 to have a preselected difference in magnetization from that of layer 16. The magnetization difference is such that the interaction between magnetostatic surface waves propagating in the layers causes nondispersive or linearly dispersive propagation, as desired.

The layers 14 and 16 may be deposited by any known method of epitaxial deposition. However, the preferred approach to depositing layers 14 and 16 is by the dipping method of liquid phase epitaxy. Liquid phase epitaxy is known to produce high quality films of ferrimagnetic material. The quality of the films is high in that they have a uniform composition over a relatively large area, the films have relatively low losses, and more complex compositions can be grown by LPE as compared to chemical vapor deposition (CVD) grown epitaxial films.

While the layers 14 and 16 of ferrimagnetic material are required to have different magnetic characteristics, they are also required to have about the same ferrimagnetic resonance linewidth or lossiness in order that the two layers 14 and 16 will have about the same effect on the characteristics of a delay line in which they are used.

It is well known that the internal magnetization of a ferrimagnetic film of, for example, yttrium iron garnet (YIG) can be varied by varying the composition of the garnet. One approach is to substitute non-magnetic trivalent ions for some of the yttrium and iron. Changing the internal magnetization changes the ferrimagnetic resonance frequency for a given bias magnetic field intensity. H. L. Glass, J. H. W. Liaw, and M. T. Elliott, "Temperature Stabilization of Ferrimagnetic Resonance Field in Epitaxial YIG by Ga, La Substitution ion," Mat. Res. Bull. Vol. 12, No. 7, July 1977, p. 735, discloses that combined substitution of gallium and lanthanum in YIG can be used to shift the field at which resonance occurs in YIG by an amount which is equivalent to a change in the resonance frequency of about one gigahertz for a given fixed bias field.

Thus, a first film of gallium, lanthanum substituted YIG may be grown to have a certain desired internal magnetization. A second film of YIG may be grown having another composition and an internal magnetization which is different from that of the first film by a desired amount. The linewidth of this second film may be adjusted, during growth, to be substantially similar to that of the first film. This may be accomplished, for example, by varying the charge compensation of the second film by the controlled incorporation therein of lead.

The control of linewidth is described in copending U.S. pat. appln. by Glass et al., Ser. No. 792,159 (and its parent application, Ser. No. 687,428, filed May 17, 1976), entitled "Minimization of the Ferrimagnetic Resonance Linewidth in Yttrium Iron Garnet Films," filed Apr. 29, 1977, assigned to the assignee of this application, and which is hereby incorporated by reference into this application.

A method whereby two such films having differing compositions can be deposited by the dipping method of liquid phase epitaxy on the opposite sides of the same substrate is disclosed in copending U.S. patent application, Ser. No. 831,033, entitled "Method of Fabricating Multiple Layer Composite" filed by Howard L. Glass and assigned to the assignee of the present application. The method calls for two substrates to be clamped to each other, face-to-face, thereby sealing one face of each of the substrates for each dipping thereof in melted flux.

Figure 2:
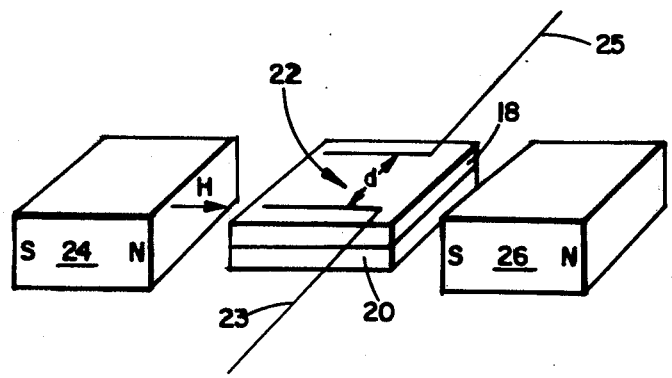
FIG. 2 is a perspective view of a magnetostatic surface wave delay line incorporating the device of the invention.

FIG. 2 shows a magnetostatic surface wave delay line comprising a layered composite 22 including portions 18 and 20. Portion 18 comprises at least one multiple magnetic layer composite 10 of the type shown in FIG. 1 while portion 20 comprises a ground plane and such other component parts as are required to form a suitable delay line. A substantially uniform bias magnetic field is established by magnets 24 and 26 which are shown with opposite poles facing each other. The magnetic field intensity vector H is in the plane of the layers 14 and 16 of FIG. 1 and perpendicular to the direction of propagation of magnetostatic surface waves. RF couplers 23 and 25 couple RF energy into and out of the magnetostatic wave respectively, at or near opposite ends of the layered composite.

Figure 3:
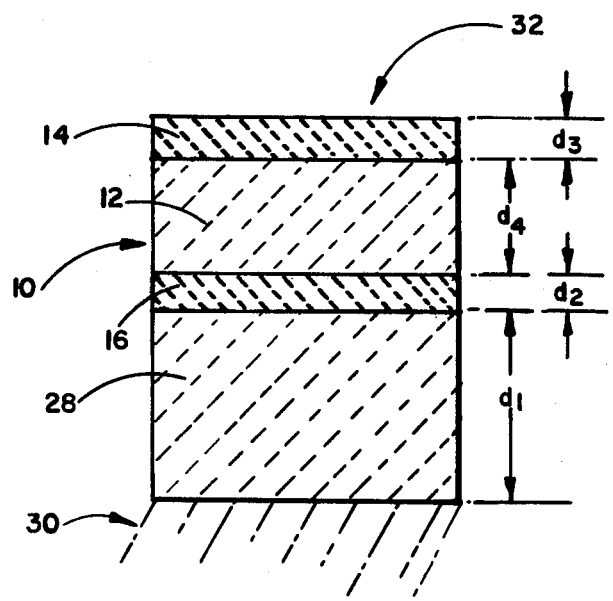
FIG. 3 is a cross-sectional view of the delay line of FIG. 2 showing some of the dimensions in greater detail.

The cross-sectional view of a layered composite 32 in FIG. 3 shows only one multiple magnetic layer composite 10 stacked with a layer 28 of magnetic-wave-inactive material separating the composite 10 from a ground plane 30. The layered composite 32 is an exemplary magnetostatic wave delay line. The thickness of layer 28 is $d_1$. The thicknesses of layers 16 and 14 of ferrimagnetic material are $d_2$ and $d_3$, respectively. The thickness of the substrate 12, on which layers 14 and 16 are deposited, is $d_4$. A useful magnetostatic surface wave delay line may be identified by selecting all of the parameters for the delay line but one. Then, using a digital computer programmed to solve Maxwell's equations for a delay line having the parameters chosen and the boundary conditions inherent in the geometry, the one parameter remaining free may be varied in a search for an optimal design. The criterion for optimality may be, for example, minimization of the rms deviation of the time-delay versus frequency characteristic from linearity over a selected range of frequencies.

Another criterion which may be selected is maximization of the bandwidth over which the time-delay versus frequency characteristic has no more than a preselected rms deviation from linearity. Other criteria may be chosen as will be apparent to those skilled in the art.

Figure 4:
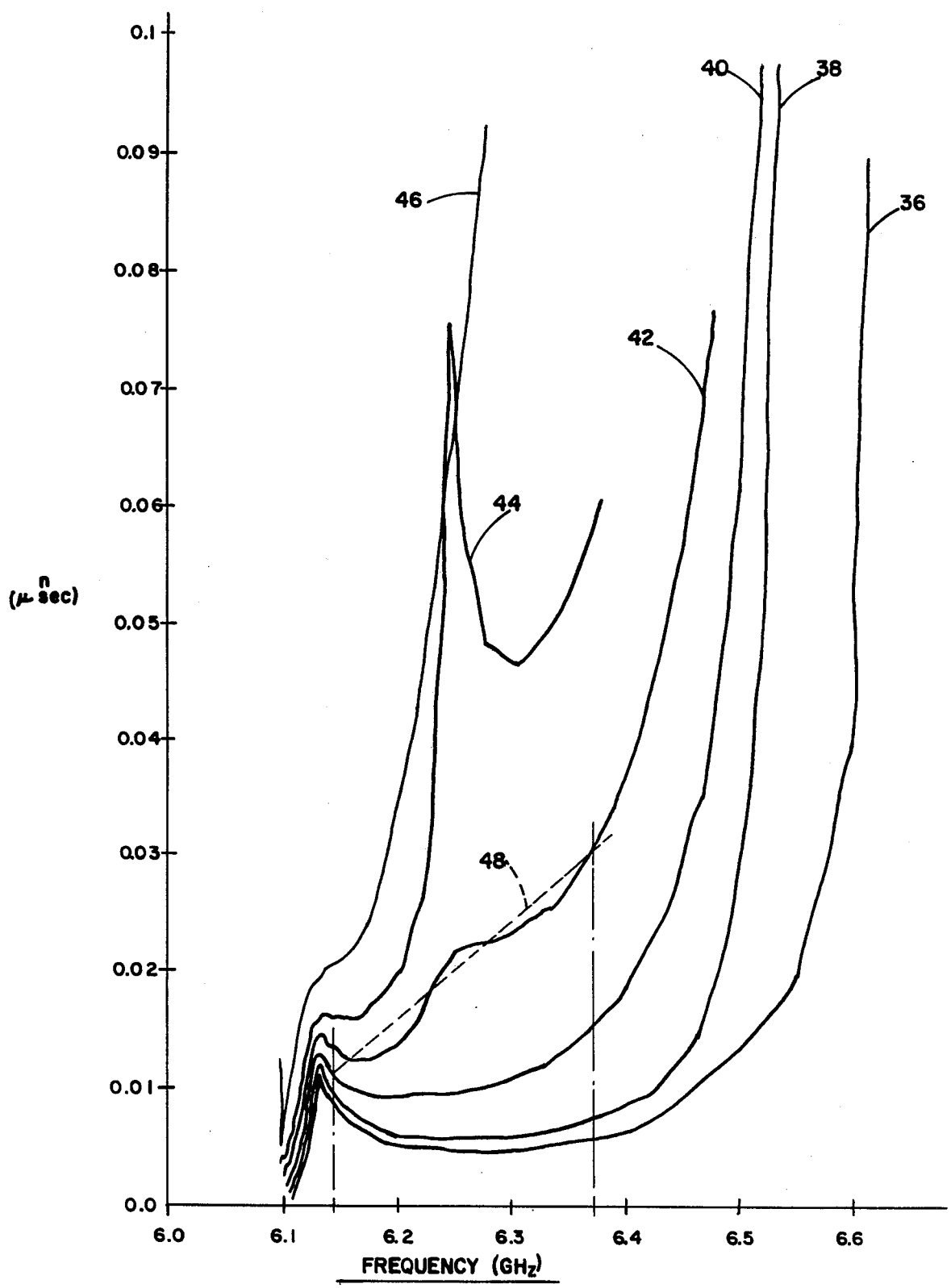
FIG. 4 shows curves obtained from a computer solution of Maxwell's equations for the delay line of FIG. 3.

FIG. 4 shows a family of time-delay versus frequency characteristics obtained from such a computer solution of Maxwell's equations. Preselected thickness parameters are $d_1 = 5$ mils, $d_2 = d_3 = 0.5$ mils. The thickness of the substrate 12, viz $d_4$, is chosen as the free variable and is varied from 0.5 to 20 mils. The several curves shown in FIG. 4 are for $d_4 = 0.5$ mils (reference numeral 36), 1.0 mils (reference numeral 38), 2.5 mils (reference numeral 40), 5 mils (reference numeral 42), 10 mils (reference numeral 44), and 20 mils (reference numeral 46). Propagation is in the forward direction. The ferrimagnetic material is YIG. The magnetic-wave-inactive material is the dielectric GGG. The internal magnetization of layer 14 is 1735 oersteds and the internal magnetization of the layer 16 is 1760 oersteds. The curves shown in FIG. 4 have a normalized ordinate, n, in microseconds. The time delay between the input and output couplers 23 and 25 can be obtained by solving the following equation for $\tau$.

$$n = \frac{2\pi}{d} \tau \left( \frac{d_2 + d_3}{2} + d_4 \right) \mu\text{sec.}$$

where d is the distance between the input coupler 23 and the output coupler 25 in centimeters; $\tau$ is the time of propagation in microseconds between the input and output couplers; and the thicknesses $d_2$, $d_3$, and $d_4$ are in centimeters.

By examination of FIG. 4, it will be seen that the curve 42 giving the time-delay versus frequency characteristic for the case where the thickness of the substrate 12 is five mils, evidences magnetic interaction between the layers of YIG 14 and 16 of the type desired. Over the range of frequencies from about 6.14 GHz to about 6.38 GHz, the dashed line 48 shows a substantially linear dispersion characteristic. The normalized time delay varies from about 0.01 to about 0.03 microseconds per centimeter in this region.

Having thus described a preferred embodiment of the invention, what is claimed is:

1. A monolithic multiple magnetic layer composite in a magnetostatic surface wave delay line having a bias magnetic field intensity oriented substantially parallel to a planar surface for propagating magnetostatic surface waves on said composite and oriented substantially perpendicular to the direction of propagation of said magnetostatic surface waves on said planar surface wherein the bias magnetic field has a substantially zero gradient in a direction perpendicular to said planar surface throughout the region of said delay line occupied by said composite, said composite comprising:
   a substrate of magnetic-wave-inactive material having first and second opposing faces and a substantially uniform thickness between said first and second faces;
   a first layer of a first magnetic-wave-active material deposited on said first face of said substrate wherein said first magnetic-wave-active material has a first preselected internal magnetization; and
   a second layer of a second magnetic-wave-active material deposited on said second face of said substrate wherein said second magnetic-wave-active material has a second internal magnetization having a preselected difference from said first internal magnetization.

2. The composite recited in claim 1 wherein said magnetic-wave-inactive material is a non-magnetic garnet.

3. The composite recited in claim 2 wherein said substrate of a non-magnetic garnet is cut from a single crystal of gadolinium gallium garnet.

4. The composite recited in claim 1 wherein said first and second magnetic-wave-active materials are first and second magnetic garnets.

5. The composite recited in claim 4 wherein said first and second magnetic garnets are primarily monocrystalline yttrium iron garnet.

6. The composite recited in claim 1 wherein said first and second magnetic-wave-active materials have approximately the same lossiness for magnetostatic surface wave propagation.

* * * * *